(12) United States Patent
Huang et al.

(10) Patent No.: US 8,138,548 B2
(45) Date of Patent: Mar. 20, 2012

(54) THIN FILM TRANSISTOR ARRAY SUBSTRATE AND METHOD FOR MANUFACTURING THE SAME

(75) Inventors: Sung-Hui Huang, Hsinchu (TW); Wei-Chou Lan, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 103 days.

(21) Appl. No.: 12/838,107

(22) Filed: Jul. 16, 2010

(65) Prior Publication Data
US 2011/0278563 A1 Nov. 17, 2011

(30) Foreign Application Priority Data
May 12, 2010 (TW) .............................. 99115179 A

(51) Int. Cl.
*H01L 29/786* (2006.01)
(52) U.S. Cl. ......... 257/347; 257/E29.296; 257/E21.411; 257/E21.46; 438/285; 438/479; 438/483
(58) Field of Classification Search .................. 438/258, 438/285, 479, 483, FOR. 200; 257/347, 257/E29.296, E21.411, E21.46
See application file for complete search history.

(56) References Cited

U.S. PATENT DOCUMENTS

| | | | | |
|---|---|---|---|---|
| 8,030,663 | B2 * | 10/2011 | Yamazaki et al. | 257/78 |
| 2011/0024740 | A1 * | 2/2011 | Yamazaki et al. | 257/43 |
| 2011/0032444 | A1 * | 2/2011 | Yamazaki et al. | 349/42 |
| 2011/0037068 | A1 * | 2/2011 | Yamazaki et al. | 257/43 |
| 2011/0084273 | A1 * | 4/2011 | Yamazaki et al. | 257/43 |
| 2011/0089419 | A1 * | 4/2011 | Yamazaki et al. | 257/43 |
| 2011/0114942 | A1 * | 5/2011 | Akimoto et al. | 257/43 |
| 2011/0133183 | A1 * | 6/2011 | Yamazaki et al. | 257/43 |
| 2011/0140096 | A1 * | 6/2011 | Kim et al. | 257/43 |

* cited by examiner

*Primary Examiner* — George Fourson, III
(74) *Attorney, Agent, or Firm* — WPAT., P.C.; Justin King

(57) ABSTRACT

A thin film transistor array substrate includes a substrate, a gate layer, a gate insulating layer, a source/drain layer, a patterned protective layer, an oxide semiconductor layer, a resin layer and a pixel electrode. The gate layer is disposed on the substrate. The gate insulating layer is disposed on the gate layer and the substrate. The source/drain layer is disposed on the gate insulating layer. The patterned protective layer is disposed on the source/drain layer and exposes a portion of the source/drain layer. The oxide semiconductor layer is disposed on the patterned protective layer and electrically connected to the source/drain layer. The resin layer is disposed on the oxide semiconductor layer and covers the oxide semiconductor layer. The pixel electrode is disposed on the resin layer and connects to the source/drain layer. The present invention also provides a method for making the thin film transistor array substrate. The thin film transistor array substrate can prevent leakage current.

10 Claims, 3 Drawing Sheets

THIN FILM TRANSISTOR ARRAY SUBSTRATE AND METHOD FOR MANUFACTURING THE SAME

This application claims the right of priority based on Taiwan Patent Application No. 099115179 entitled "Thin Film Transistor Array Substrate and Method for Manufacturing the Same", filed on May 12, 2010, which is incorporated herein by reference and assigned to the assignee herein.

BACKGROUND

1. Technical Field

The present invention relates to a transistor array substrate and in particular to a thin film transistor array substrate and method for manufacturing the same.

2. Related Art

Thin film transistor array substrates have been widely used in display applications such as liquid crystal display (LCD), electrophoretic display (EPD), and organic light emitting diode (OLED) display.

Taking the application in LCD for an example, a conventional thin film transistor array substrate includes a substrate, a metal gate layer formed on the substrate, a gate insulating layer formed on the metal gate layer, a source/drain layer formed on the gate insulating layer, an amorphous indium gallium zinc oxide (a-IGZO) layer formed on the source/drain layer, a protective layer formed on the a-IGZO layer and a pixel electrode formed on the protective layer.

However, in the above thin film transistor array substrate, the protective layer is directly formed on the a-IGZO layer, and because the protective layer is usually made of silicon oxide which easily cause the problem of leakage current. Thus, the application of such thin film transistor array substrate is limited.

Therefore, there is a desire to avoid producing the leakage current and improve the performance of the thin film transistor array substrate.

BRIEF SUMMARY

The present invention provides a thin film transistor array substrate which is capable of avoiding producing leakage current.

The present invention also provides a method for manufacturing the thin film transistor array substrate and the thin film transistor array substrate manufactured using the method can avoid producing leakage current.

A thin film transistor array substrate includes a substrate, a gate layer, a gate insulating layer, a source/drain layer, a patterned protective layer, an oxide semiconductor layer, a resin layer and a pixel electrode. The gate layer is disposed on the substrate. The gate insulating layer is disposed on the gate layer and the substrate. The source/drain layer is disposed on the gate insulating layer. The patterned protective layer is disposed on the source/drain layer and exposes a portion of the source/drain layer. The oxide semiconductor layer is disposed on the patterned protective layer and is electrically connected to the source/drain layer. The resin layer is disposed on the oxide semiconductor layer and covers the oxide semiconductor layer. The pixel electrode is disposed on the resin layer and is connected to the source/drain layer.

Another embodiment of the present invention also provides a method for manufacturing the thin film transistor array substrate. Firstly, a gate layer is formed on a substrate. Then, a gate insulating layer is formed on the gate layer and the substrate. After that, a source/drain layer is formed on the gate insulating layer. In succession, a patterned protective layer is formed on the source/drain layer. The patterned protective layer exposes a portion of the source/drain layer. Then, an oxide semiconductor layer is formed on the patterned protective layer and is electrically connected to the source/drain layer. After that, a resin layer is formed on the oxide semiconductor layer and covers the oxide semiconductor layer. Finally, a pixel electrode is formed on the resin layer and is connected to the source/drain layer.

In the thin film transistor array substrate of the present embodiment, the patterned protective layer is disposed on the source/drain layer and the oxide semiconductor layer is disposed on the patterned protective layer. Thus, the leakage current can be reduced or even be avoided. As a result, the performance of the thin film transistor array substrate is improved.

Other aspects, details, and advantages of the present corner joint are further described accompanying with preferred embodiments and figures as follows.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
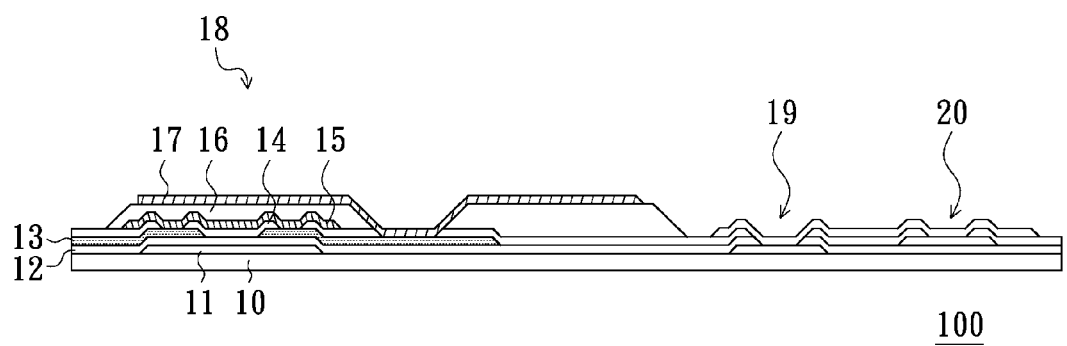
FIG. 1A is a cross sectional schematic view of a thin film transistor array substrate in accordance with an embodiment of the present invention.

FIG. 1A is a cross sectional schematic view of a thin film transistor array substrate in accordance with an embodiment of the present invention. As shown in FIG. 1A, the thin film transistor array substrate 100 includes a thin film transistor 18. The thin film transistor 18 includes a substrate 10, a gate layer 11, a gate insulating layer 12, a source/drain layer 13, a patterned protective layer 14, an oxide semiconductor layer 15, a resin layer 16 and a pixel electrode 17. The gate layer 11 is disposed on the substrate 10. The gate insulating layer 12 is disposed on the substrate 10 and the gate layer 11. The source/drain layer 13 is disposed on the gate insulating layer 12. The patterned protective layer 14 is disposed on the source/drain layer 13 and exposes a portion of the source/drain layer 13. The oxide semiconductor layer 15 is disposed on the patterned protective layer 14 and is electrically connected to the source/drain layer 13. The resin layer 16 is disposed on the oxide semiconductor layer 15 and covers the oxide semiconductor layer 15. The pixel electrode 17 is disposed on the resin layer 16 and is connected to the source/drain layer 13. The oxide semiconductor layer 15 can be an amorphous oxide that comprises at least one of indium, gallium, and zinc, for example, amorphous indium gallium zinc oxide (a-IGZO).

Figure 1B:
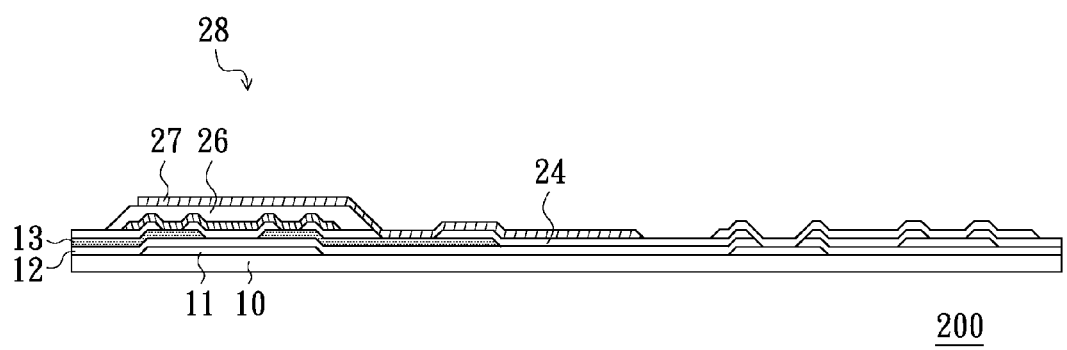
FIG. 1B is a cross sectional schematic view of a thin film transistor array substrate in accordance with another embodiment of the present invention.

In the present embodiment, the thin film transistor array substrate 100 can be used in electrophoretic display (EPD), but the application of the thin film transistor array substrate 100 is not limited only to EPD. Applying appropriate structure changes, the thin film transistor array substrate 100 according to various embodiments of the present invention can also be used in other display applications. For example, Referring to FIG. 1B, a thin film transistor array substrate 200 is employed in a liquid crystal display (LCD). The thin film transistor array substrate 200 includes a thin film transistor 28 in which a portion of pixel electrodes 27 is directly disposed on a patterned protective layer 24. As a result, a portion of the resin layer 26 that is disposed between the pixel electrode 27 and the patterned protective layer 24 can be omitted.

Additionally, in the present embodiment, the thin film transistor array substrate 100 further includes a jumper portion 19 and a welding pad portion 20. The jumper portion 19 is connected between the welding pad portion 20 and other portion of the thin film transistor array substrate 100. The welding pad portion 20 is for electrically connecting to external components such as external circuit board or control circuit.

By the structure arrangement of the source/drain layer 13, the patterned protective layer 14 and the oxide semiconductor layer 15, that is, the patterned protective layer 14 is disposed on the source/drain layer 13 and the oxide semiconductor layer 15 is disposed on the patterned protective layer 14, the thin film transistor array substrate 100 can reduce the leakage current and improve the performance of the thin film transistor array substrate 100. In addition, because the jumper portion 19 and the welding pad portion 20 omit the resin layer, thus the problems of IC bonding and circuit corrosion can also be overcome.

A method for manufacturing the thin film transistor array substrate 100 will be described accompanying with figures as follows.

Figure 2A:
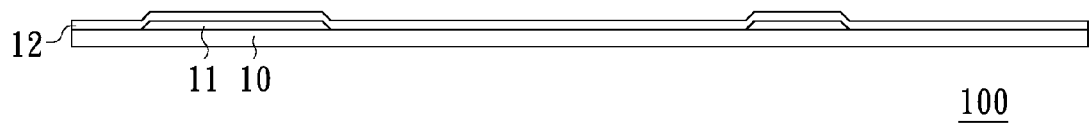
FIGS. 2A-2F are cross sectional schematic views showing a method for manufacturing the thin film transistor array substrate shown in FIG. 1A.

Referring to FIG. 2A, firstly, a gate layer 11 is formed on the substrate 10 and then the gate insulating layer 12 is formed on the substrate 10 and the gate layer 11. The method for forming the gate layer 11 for example includes depositing a metal layer on the substrate 10 and then performing a patterning process to form the gate layer 11. The method for forming the gate insulating layer 12, for example, but not limited to, includes chemical vapor deposition (CVD). Specifically, in the present embodiment, the gate layer 11 can be metal such as aluminum, aluminum-neodymium alloy, molybdenum, chromium, molybdenum-chromium alloy, copper, or combination thereof. The gate insulating layer 12 can be silicon nitride, silicon oxide, aluminum oxide, yttrium oxide, or combination thereof.

Figure 2B:
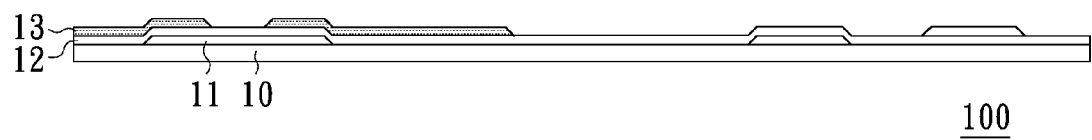

Referring to FIG. 2B, after forming the gate insulating layer 12, a source/drain layer 13 is formed on the gate insulating layer 12. The method for forming the source/drain layer 13 for example includes depositing a layer of metal material and then performing a pattering process. The source/drain layer 13 can be metal such as aluminum, aluminum-neodymium alloy, molybdenum, chromium, molybdenum-chromium alloy, copper, or combination thereof.

Figure 2C:
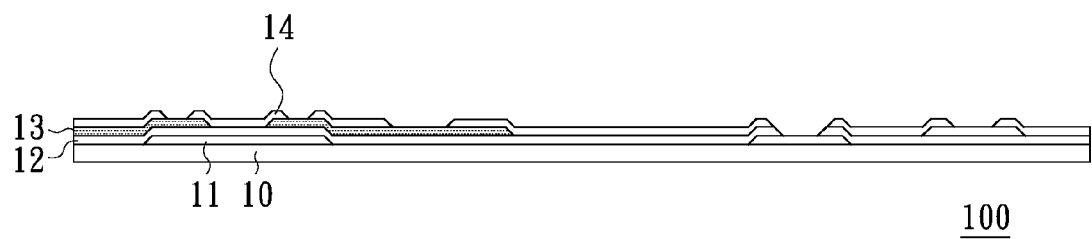

As shown in FIG. 2C, after forming the source/drain layer 13, a patterned protective layer 14 is formed on the source/drain layer 13. The patterned protective layer 14 exposes a portion of the source/drain layer 13. The method for forming the patterned layer 14, for example, but not limited to, includes chemical vapor deposition. The patterned protective layer 14 can be silicon nitride, silicon oxide, phenolic resin, polyimide, or combination thereof. In addition, the patterned protective layer 14 can also be a composite insulating layer of organic material and inorganic material.

Figure 2D:
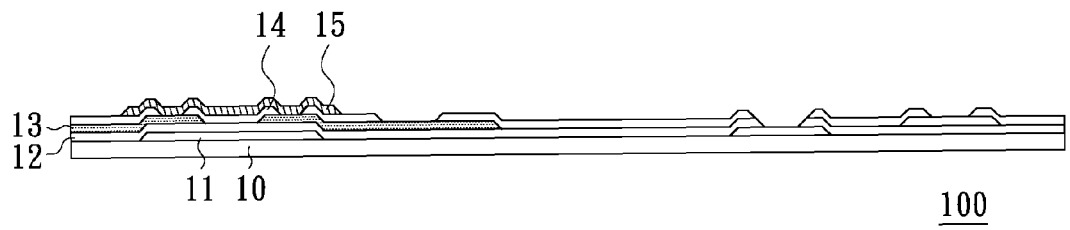

Referring to FIG. 2D, after forming the patterned protective layer 14, an oxide semiconductor layer 15 is formed on the patterned protective layer 14. The oxide semiconductor layer 15 can be an amorphous oxide that comprises at least one of indium, gallium and zinc such as amorphous indium gallium zinc oxide (a-IGZO). In addition, during the formation of the oxide semiconductor layer 15, oxygen and argon gas can be introduced.

Figure 2E:
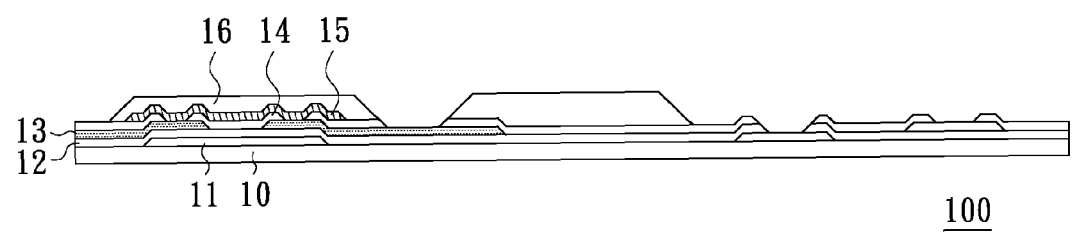

As shown in FIG. 2E, after forming the oxide semiconductor layer 15, a resin layer 16 is formed on the oxide semiconductor layer 15. The resin layer 16 covers the oxide semiconductor layer 15. The resin layer 16 can be positive or negative photo resist.

Figure 2F:
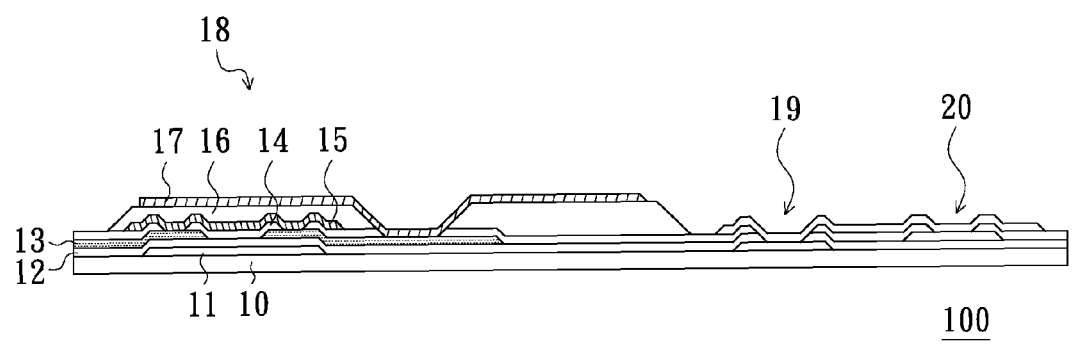

Finally, referring to FIG. 2F, the pixel electrode 17 is formed on the resin layer 16 and electrically connected to the source/drain layer 13 thereby obtaining the thin film transistor array substrate 100. The pixel electrode 17 can be indium tin oxide, indium zinc oxide, molybdenum, chromium, molybdenum-chromium alloy, or combination thereof.

As described above, in the thin film transistor array substrate of the present invention, the patterned protective layer is disposed on the source/drain layer and the oxide semiconductor layer is disposed on the patterned protective layer. Such arrangement can reduce or even eliminate the leakage current thereby improving the performance of thin film transistor array substrate. In addition, such arrangement also can avoid the problems of IC bonding and circuit corrosion. As a result, the performance of the thin film transistor array substrate is further improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A thin film transistor array substrate, comprising:
   a substrate;
   a gate layer, disposed on the substrate;
   a gate insulating layer, disposed on the gate layer and the substrate;
   a source/drain layer, disposed on the gate insulating layer;
   a patterned protective layer, disposed on the source/drain layer and exposing a portion of the source/drain layer;
   an oxide semiconductor layer, disposed on the patterned protective layer and electrically connected to the source/drain layer;
   a resin layer, disposed on the oxide semiconductor layer to cover the oxide semiconductor layer; and
   a pixel electrode, disposed on the resin layer and connected to the source/drain layer.

2. The thin film transistor array substrate of claim 1, wherein the oxide semiconductor layer is an amorphous oxide that comprises at least one of indium, gallium, zinc.

3. The thin film transistor array substrate of claim 1, wherein the oxide semiconductor layer comprises amorphous indium gallium zinc oxide.

4. The thin film transistor array substrate of claim 1, wherein the resin layer is positive or negative photo resist.

5. The thin film transistor array substrate of claim 1, wherein a portion of the pixel electrode is directly disposed on the patterned protective layer.

6. A method for manufacturing thin film transistor array substrate, comprising:
   forming a gate layer on a substrate;
   forming a gate insulating layer on the gate layer and the substrate;

forming a source/drain layer on the gate insulating layer;

forming a patterned protective layer on the source/drain layer to expose a portion of the source/drain layer;

forming an oxide semiconductor layer on the patterned protective layer, the oxide semiconductor layer being electrically connected to the source/drain layer;

forming a resin layer on the oxide semiconductor layer to cover the oxide semiconductor layer; and forming a pixel electrode on the resin layer, the pixel electrode being connected to the source/drain layer.

7. The method for manufacturing the thin film transistor array substrate of claim 6, wherein the oxide semiconductor layer is an amorphous oxide that comprises at least one of indium, gallium, zinc.

8. The method for manufacturing the thin film transistor array substrate of claim 6, wherein the oxide semiconductor layer comprises amorphous indium gallium zinc oxide.

9. The method for manufacturing the thin film transistor array substrate of claim 6, wherein the resin layer is positive or negative photo resist.

10. The method for manufacturing the thin film transistor array substrate of claim 6, wherein during the formation of the oxide semiconductor layer, oxygen and argon gas are introduced.

* * * * *